United States Patent
Tang

(10) Patent No.: US 6,670,858 B2
(45) Date of Patent: Dec. 30, 2003

(54) HIGH SPEED VOLTAGE-CONTROLLED RING OSCILLATOR

(75) Inventor: Benjamim Tang, Hawthorne, CA (US)

(73) Assignee: Primarion, Inc., Tempe, AZ (US)

( * ) Notice: Subject to any disclaimer, the term of this patent is extended or adjusted under 35 U.S.C. 154(b) by 0 days.

(21) Appl. No.: 10/004,364

(22) Filed: Nov. 1, 2001

(65) Prior Publication Data

US 2002/0097098 A1 Jul. 25, 2002

Related U.S. Application Data

(60) Provisional application No. 60/244,965, filed on Nov. 1, 2000.

(51) Int. Cl.⁷ .............................................. H03B 27/00
(52) U.S. Cl. ..................................... 331/57; 331/177 R
(58) Field of Search .............................. 331/57, 34, 42, 331/177 R; 327/538

(56) References Cited

U.S. PATENT DOCUMENTS

| | | | | |
|---|---|---|---|---|
| 4,884,041 A | * | 11/1989 | Walker | 331/57 |
| 5,418,498 A | * | 5/1995 | DeVito et al. | 331/57 |
| 5,748,125 A | | 5/1998 | Cederbaum et al. | |
| 5,789,989 A | | 8/1998 | Paschal et al. | |
| 6,396,358 B1 | * | 5/2002 | Poss et al. | 331/57 |

FOREIGN PATENT DOCUMENTS

| | | |
|---|---|---|
| EP | 0 828 348 A2 | 3/1998 |
| EP | 0 964 516 A1 | 12/1999 |

OTHER PUBLICATIONS

PCT—International Search Report; Sep. 11, 2002; PCT/US01/46015; 4 pgs.

* cited by examiner

Primary Examiner—Robert Pascal
Assistant Examiner—Joseph Chang
(74) Attorney, Agent, or Firm—Theodore E. Galanthay

(57) ABSTRACT

A high speed ring voltage-controlled oscillator (VCO) system is provided. The ring VCO system includes a plurality of interpolation stages coupled in a "look-ahead" configuration. Each interpolation stage receives two signal inputs and outputs a single differential voltage representative of a time delay interpolation between the two input signals. In accordance with the invention, each interpolation stage receives a first signal input from the immediately previous stage and a second signal input from the output of a different stage. In this manner, the delay stages in the ring VCO can generate a variable delay by interpolating between inputs with small relative delays without adding additional delay to the total loop delay.

42 Claims, 6 Drawing Sheets

HIGH SPEED VOLTAGE-CONTROLLED RING OSCILLATOR

CROSS REFERENCE TO RELATED APPLICATION

This application includes subject matter that is related to and claims priority from U.S. Provisional Patent Application Serial No. 60/244,965, filed on Nov. 1, 2000, entitled, "High Speed Voltage-Controlled Ring Oscillator."

FIELD OF INVENTION

The present invention relates generally to a high speed voltage-controlled ring oscillator and, in particular, to an improved high speed voltage-controlled ring oscillator system and method having "look-ahead" interpolation.

BACKGROUND OF THE INVENTION

Voltage-controlled oscillators (VCOs) generate an oscillating signal at a frequency proportional to an externally applied voltage. These types of circuits are useful for tracking and matching signal frequencies as they shift due to thermal variations, power supply fluctuations, and other sources of frequency phase-shifts. VCOs are found particularly often in phase-locked loop circuits (PLL) used for clock generation and synchronization. Such PLL circuits are often employed in receivers, transceivers, frequency modulators, frequency demodulators, modems and various other high frequency electrical devices.

FIG. 1 illustrates, in block format, a conventional ring oscillator VCO 100. Ring VCO includes a chain of voltage-controlled delay stages, 110, 120, 130 and 140, coupled together in a negative feedback loop 150. Each delay stage includes a delay element, 160, 170, 180 and 190, and an analog summer, 165, 175, 185 and 195. As is common in conventional ring VCOs, the delay element typically includes one or more buffers and/or inverters. The delay element contributes to a delay of a signal propagated through VCO 100 and consequently limits a maximum frequency over which VCO 100 can operate. In general, the circuit will oscillate with a period, T, equal to the voltage-controlled cell delay multiplied by twice the number of delay stages (i.e., the signal must propagate through the inverting path twice to return to its original value), as provided by the following Equation 1:

$$T = t_p 2N \quad (1)$$

where: $t_p$ is the voltage-controlled cell delay; and N is the number of delay stages in the loop.

Consequently, the frequency of oscillation, f, of the circuit is inversely proportional to the period as provided by the following Equation 2:

$$f = 1/T = \frac{1}{t_p 2N} \quad (2)$$

As the operating frequency for electrical devices continues to rise, e.g., high frequency communication devices, circuitry within the devices must be able to accommodate and operate in the higher frequency bandwidths. In other words, an operating frequency in the gigahertz (GHz) range requires various electrical devices to reduce internal delay times in order to accommodate this high frequency. It is clear from Equation 2, that as the operating frequency increases, the allowable delay time decreases in an inversely proportional manner.

The delay stages of the ring oscillators may be configured in a variety of ways. For example, varactor tuning of an RC delay, bias modulation and delay interpolation may be used to form a variable delay stage. Of these various configurations, interpolation is often desirable because the delay stages provide a relatively linear output over a relatively wide tuning range. However, ring oscillators that use interpolation techniques often require an additional delay stage or element which is generally undesirable.

With continued reference to conventional ring VCO 100, a four stage delay interpolation system is shown. The minimum loop delay achievable with this system corresponds to the delay from the stages and the maximum delay is twice the number of stages. The minimum oscillator period is twice the loop delay, or equivalently 8 delays, and the maximum oscillator period is equivalently 16 delays.

Accordingly, an improved ring VCO having fewer delay stages for high speed operation, especially in higher frequencies, is desired. In addition, an improved system and method for signal interpolation for a high speed ring VCO is desired.

SUMMARY OF THE INVENTION

The present invention overcomes the problems outlined above and provides an improved high speed voltage-controlled ring oscillator system. In particular, the present invention provides a voltage-controlled oscillator having a plurality of interpolation stages coupled together in a "look-ahead" interpolation configuration. Each interpolation stage includes a signal output and two signal inputs, such that a first input represents the signal output of the immediately previous stage, and the second input represents the signal output of the immediately previous second stage.

In this manner, relative to a delay interpolation VCO, look-ahead interpolation eliminates a delay element of each stage, thereby providing a high speed voltage-controlled ring oscillator system capable of achieving a higher maximum operating frequency.

BRIEF DESCRIPTION OF THE DRAWINGS

These and other features, aspects and advantages of the present invention will become better understood with reference to the following description, appending claims, and accompanying drawings where:

DETAILED DESCRIPTION

The present invention relates to an improved high-speed voltage-controlled ring oscillator. Moreover, the present invention provides an improved system and method for high-speed voltage-controlled oscillation and, in particular, a ring-based voltage-controlled oscillator (VCO) having "look-ahead" interpolation.

A voltage-controlled ring oscillator system of the present invention includes a "look-ahead" interpolation architecture.

In other words, rather than interpolating only the output of the immediately previous stage and a delayed version of that same output, as in conventional interpolation techniques, look-ahead stage interpolation receives signal inputs from the outputs of at least two of the previous stages. In a conventional ring VCO configuration (e.g., ring VCO 100), a single signal input from the stage immediately previous is divided equally to form two equal inputs to the stage. One of the signal inputs represents a first input and the other signal input is inverted and represents the second signal input. Unlike a conventional ring VCO, a ring VCO of the present invention receives two inputs unrepresentative of a single stage output; rather, the two inputs are from two different stage outputs. To facilitate understanding of the present invention, a detailed description of the exemplary Figures will follow.

Figure 2:
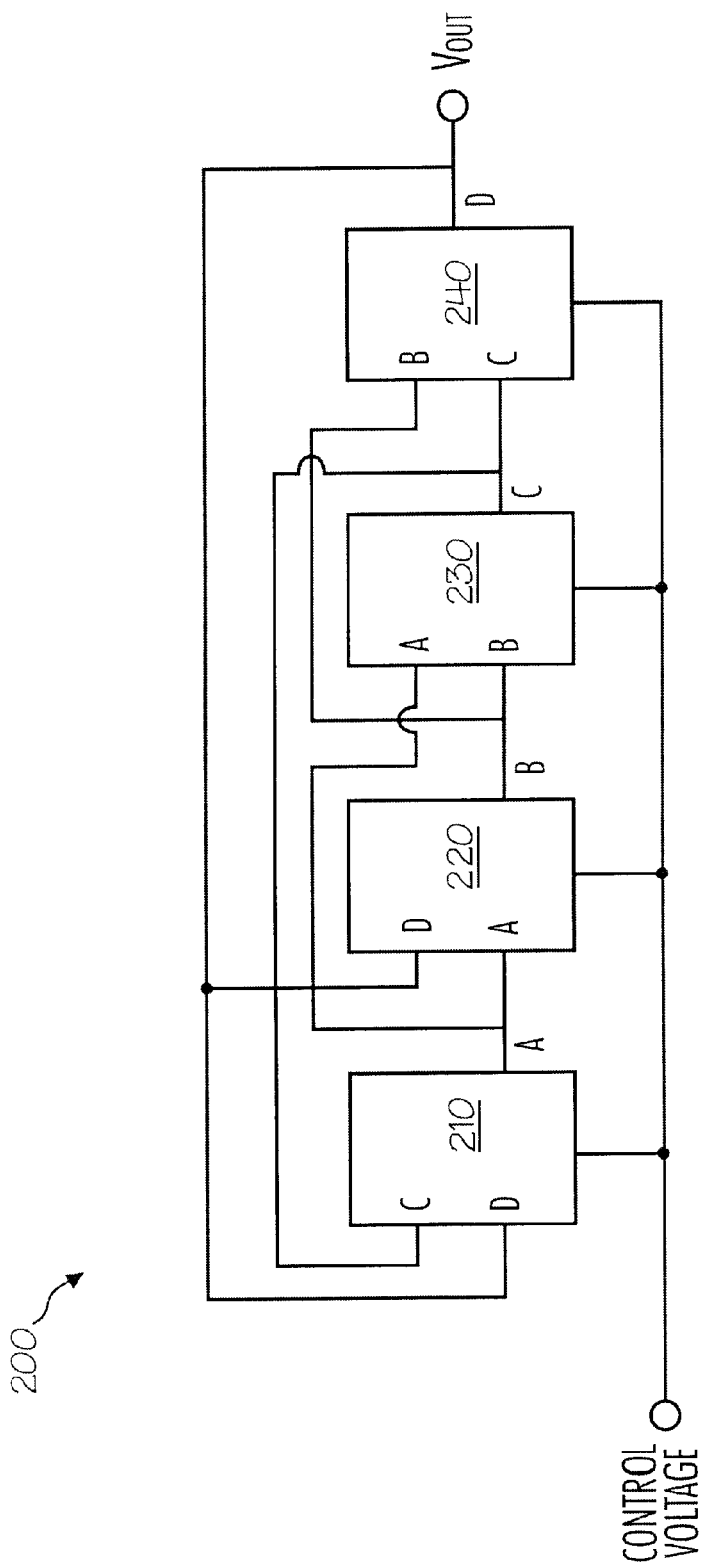
FIGS. 2 and 3 illustrate, in block format, a voltage-controlled ring oscillator having a "look-ahead" interpolation architecture in accordance with the present invention.

FIG. 2 illustrates, in block format, a voltage-controlled ring oscillator system 200 in accordance with one embodiment of the present invention. System 200 illustrates a "look-ahead" interpolation architecture for a four stage ring oscillator. It should be appreciated that the detailed description and Figures contained herein are merely illustrative of exemplary embodiments and are not intended to be limiting. For example, the number of stages of a ring VCO of the present invention can be increased beyond the illustrative four-stage VCO depicted herein.

Exemplary ring VCO 200 includes a plurality of interpolation stages, 210, 220, 230 and 240, with each stage having an output, A, B, C and D, respectively. Each interpolation stage receives two inputs, whereby the inputs are not from the same stage output. In other words, each interpolation stage, in accordance with the present invention, receives one input from one of the other stage outputs and a second input from a second stage output, different from the stage supplying the first input. For example, interpolation stage 240, of exemplary VCO 200, receives a signal input from the output of stage 230 or "C" on FIG. 2, and a second signal input from the output of stage 220 or "B" on the same Figure. In a similar manner, interpolation stage 230 receives a signal input from the output of stage 210 or "A" and a signal input from the output of stage 220 or "B." Thus, each interpolation stage receives two inputs representative of two different stage outputs.

Figure 1:
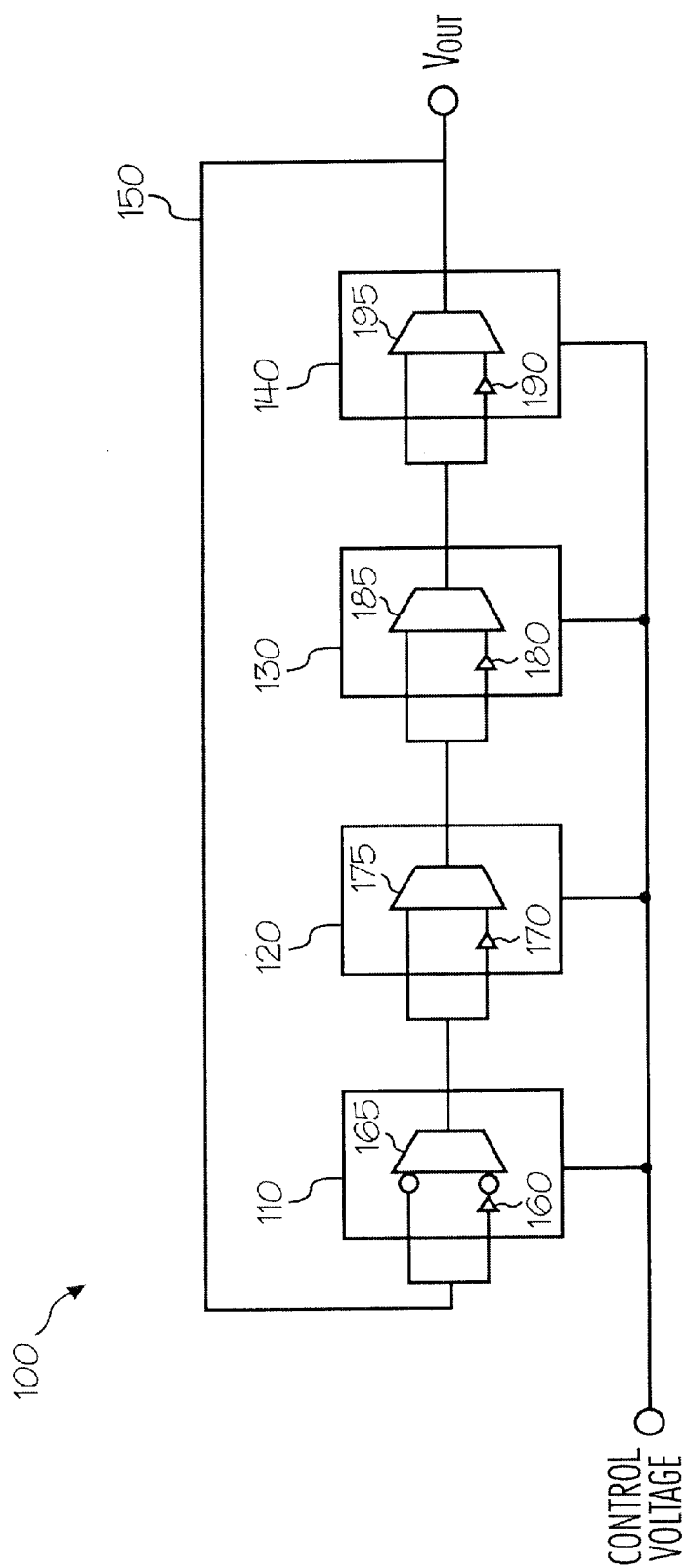
FIG. 1 illustrates, in block format, a conventional delay interpolation voltage-controlled ring oscillator.
Figure 3:
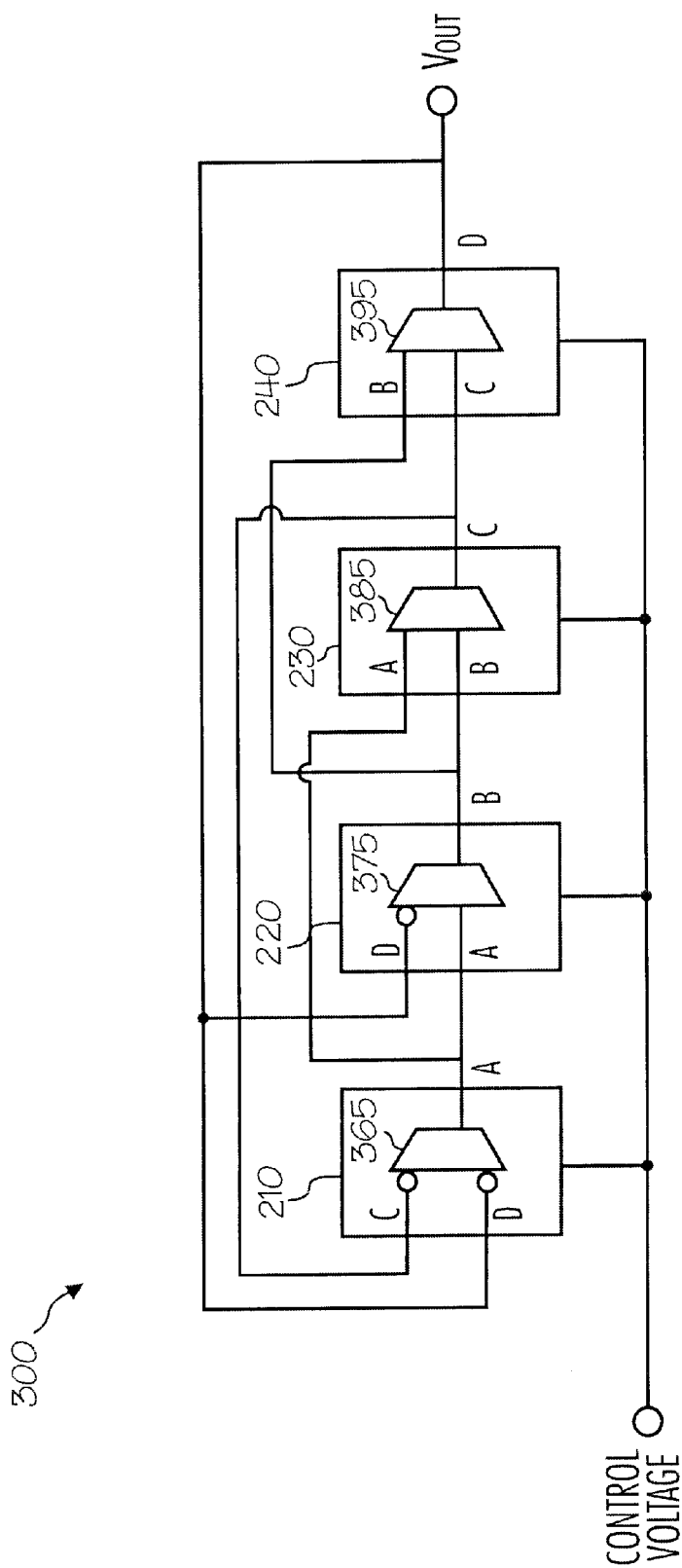

FIG. 3 illustrates, in block format, a voltage-controlled ring oscillator system 300 in accordance with one embodiment of the present invention. System 300 is similar to system 200, therefore, where noted, like numerals represent like elements. As such, system 300 is configured in the look-ahead interpolation as previously explained for system 200. System 300 includes an analog summer, 365, 375, 385 and 395, within each interpolation stage, 210, 220, 230 and 240, respectively. Unlike a conventional ring VCO, e.g., ring VCO 100, the interpolation stages of the present invention do not include any additional delay elements, e.g., delay element 160–190. By employing a look-ahead architecture, the additional delay stage common to conventional ring oscillator systems can be eliminated. In this manner, due to the relationship between the frequency, "f", and the period, "T", as set forth in Equation 2 herein, as the period of the system decreases, the available maximum operating frequency of the system increases. Thereby, a ring VCO employing look-ahead interpolation can achieve a higher maximum operating frequency than a conventional ring VCO design, such as ring VCO 100. Moreover, due to the configuration of ring VCO 200, the system has a minimum loop delay of only two stages and a maximum loop delay of twice the two stages or four. This represents a significant decrease in delay over the four-stage ring VCO of FIG. 1.

In accordance with one embodiment of the invention, the "high side" or fast signal input to the interpolation stage is limited. With continued reference to FIG. 3, each of the interpolation stages includes a "fast" signal input and a delayed signal input. For example, interpolation stage 230 receives inputs A and B, which correspond to the output of stage 210 and the output of stage 220, respectively.

Because the output of 220(B) occurs after the output of stage 210(A), the signal representing B is delayed with respect to the signal representing A. Thus, the "fast" signal input to interpolation stage 230 is input A and the delayed signal input is input B. In accordance with this particular embodiment, the weight of summer 385 of stage 230 assigned to input A is limited to 80%, thus guaranteeing the weight assigned to input B is at least 20%. This technique helps to improve stability of the ring oscillator system by ensuring that there is some minimum coupling between adjacent stages in the ring. Otherwise, the ring could behave as two independent rings, with A coupled to C and B coupled to D, but no coupling between A/C and B/D.

Figure 4:
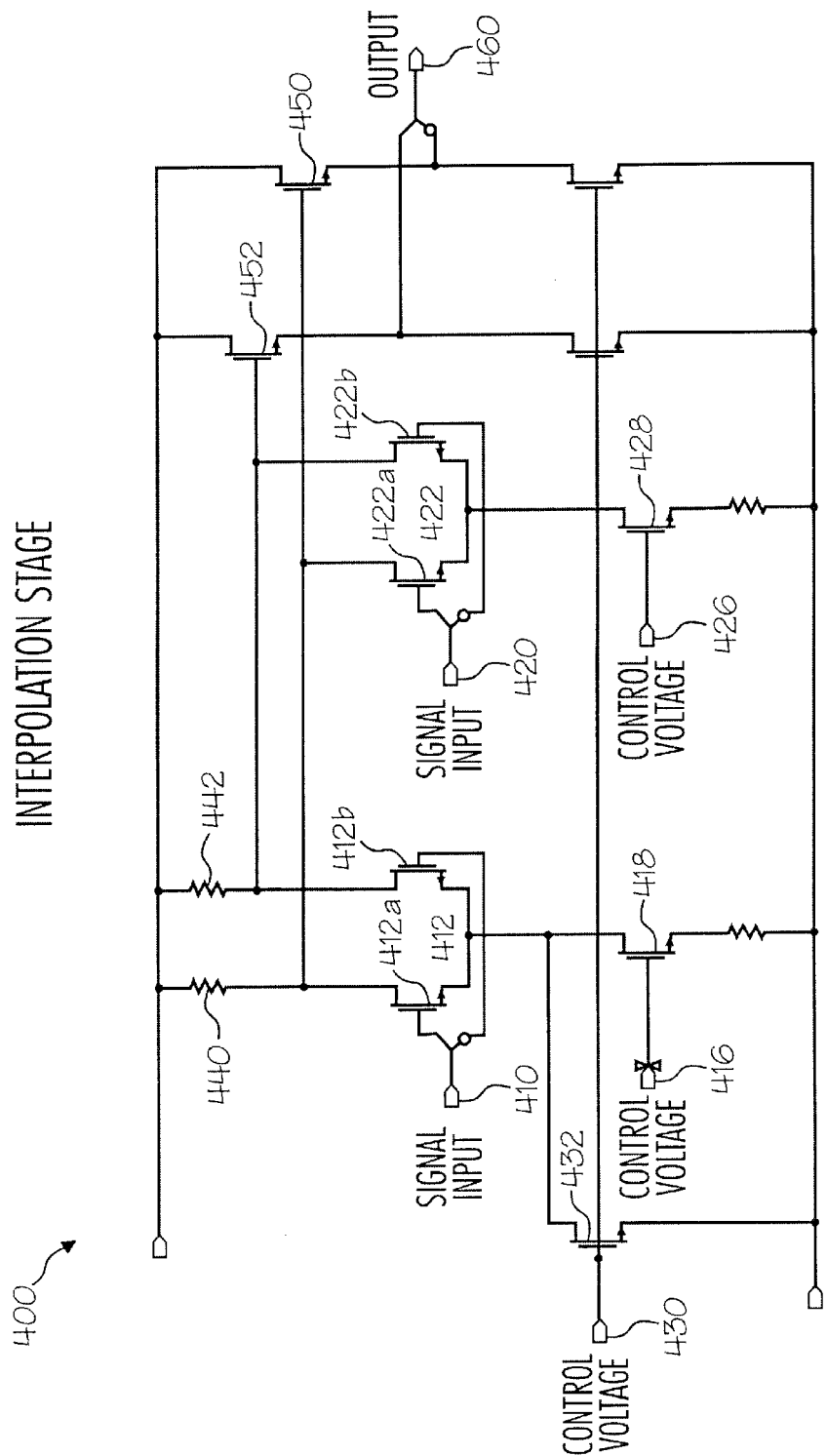
FIG. 4 schematically illustrates an exemplary interpolation stage in accordance with the present invention.

FIG. 4 schematically illustrates an exemplary interpolation stage 400 for use in a ring VCO in accordance with the present invention. Although stage 400 illustrates an analog summer circuit formed using CMOS architecture, it should be appreciated that other suitable architecture, such as bipolar, may be used in accordance with the present invention. Interpolation stage 400 is configured to interpolate a time delay between two input signals. In particular, the stage is designed to interpolate time delays (with an additional delay added by the stage) between signals having substantially the same waveform and a slight relative delay between them.

Stage 400 includes a first input port 410 coupled to a differential pair 412, a second input port 420 coupled to a differential pair 422, a first control voltage port 416 coupled to current source 418, a second control voltage port 426 coupled to a current source 428, an additional control voltage input 430 coupled to a current source 432, loads 440 and 442, source followers 450 and 452, and an output port 460.

In operation, a first differential signal received at first input port 410 is applied to differential pair 412, which includes two switching elements 412a and 412b, and a second differential signal received at second differential input port 420 is applied to a differential pair 422, which includes two switching elements 422a and 422b. In general, the first and second signals are the same waveform, except one signal is slightly delayed from the other. For example, with combined reference to FIG. 3, signal input B to analog summer 385 is slightly delayed from signal input A, but the two signals are substantially the same waveform. The switching elements may include any suitable electrical switching device, such as a transistor.

A first and second control voltage is applied to ports 416 and 426 to generate a current through current sources 418 and 428, respectively. Current sources 418 and 428 may include any suitable electrical device capable of generate a current, such as a transistor.

Additional control voltage input 430 provides a fixed current through current source 432 to differential pair 412. In this manner, even if the current though current sources 418 and 428 is steered completely through differential pair 422, a fixed amount of current remains available for differential pair 412.

The current in differential pair 412 is switched according to the input signal at first input 410, and the current in differential pair 422 is switched according to the input signal at second input 420. The current from the two differential pairs is summed, for example, by tying together the drains of switching elements 412a and 422a and the drains of switching elements 412b and 422b. The combined current is applied to loads 440 and 442 to generate differential voltages. Preferably, loads 440 and 442 are resistive loads of a resistance suitable to generate the desired voltages. Since the signals at the inputs are slightly delayed versions of the same waveform, the delay to the signal of the differential voltages can be varied by changing the ratio of current through the differential pairs 412 and 422.

Source followers 450 and 452 provide a signal buffer on the differential voltages. The source followers may include any suitable electrical buffer device, such as a transistor. The differential voltage from the source followers is provided to output port 460, the output of the interpolation stage.

Figure 5:
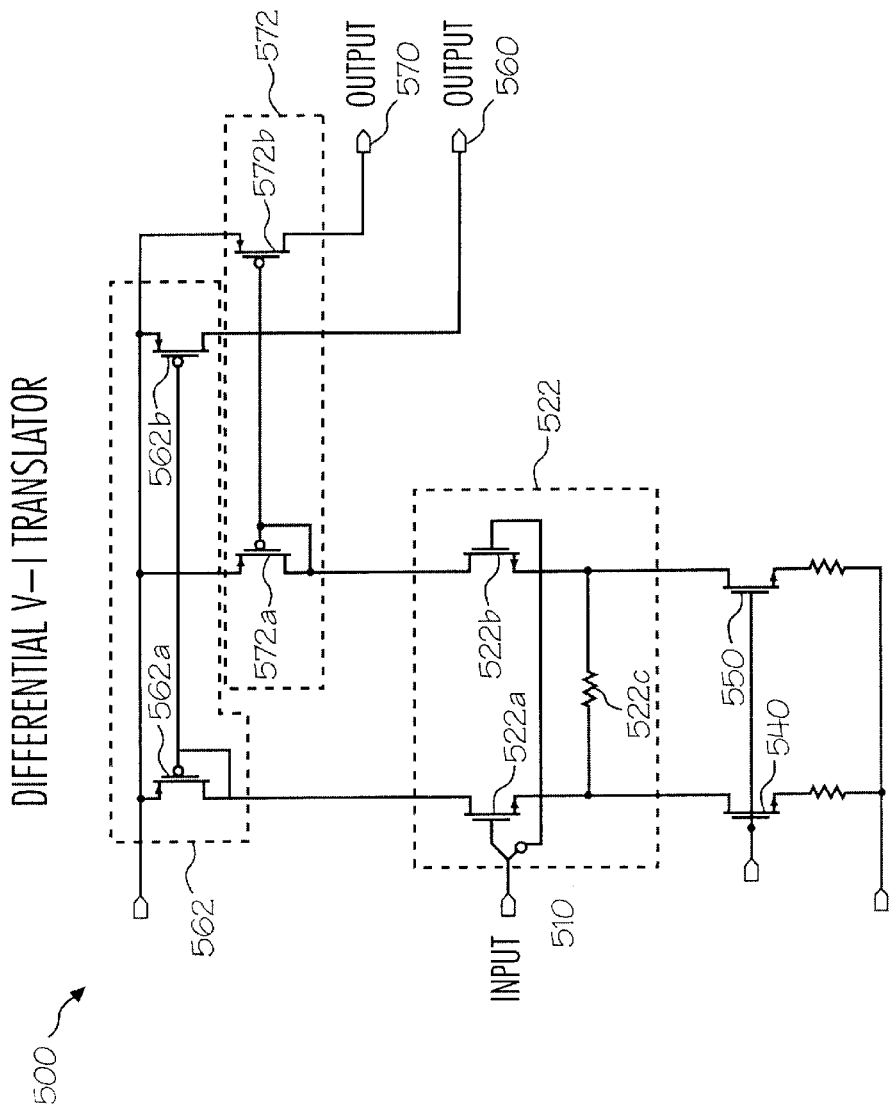
FIG. 5 schematically illustrates an exemplary voltage to current translator in accordance with the present invention.

FIG. 5 schematically illustrates an exemplary differential voltage-to-current (V-I) translator 500 for use in a ring VCO in accordance with the present invention. In particular, with combined reference to FIG. 4, the control voltages applied to ports 416 and 426 may be generated using V-I translator 500, such that the current through current sources 418 and 428 is substantially constant. In other words, the control voltage may be used to steer a substantially constant current to either differential pair 412 or differential pair 422.

V-I translator 500 includes an input port 510, a degenerated differential pair 522, current sources 540 and 550, a first current mirror 562, a second current mirror 572, a first output port 560, and a second output port 570.

In operation, a differential voltage is applied to V-I translator 500 at input port 510 and received at degenerated differential pair 522. Degenerated differential pair 522 includes switching elements 522a and 522b (i.e., transistors) and a resistor 522c. Degenerated differential pair 522 steers the current generated by current sources 540 and 550 based on the differential voltage applied to the input. V-I translator 500 is configured such that the sum of the current from degenerated differential pair 522, for example, by tying together the drains of switching elements 522a and 522b, is substantially equal to the sum of the current from current sources 540 and 550, and the difference in the drain currents in switching elements 522a and 522b is dependent upon the differential voltage at the input.

The drain current of switching element 522a is mirrored by current mirror 562, providing an output at port 560. Similarly, the drain current of switching element 522b is mirrored by current mirror 572, providing an output at port 570. Current mirrors 562 and 572 may include any electrical devices suitable for current mirroring, such as transistors 562a and 562b, and transistors 572a and 572b, respectively. As previously mentioned, the voltages at output ports 560 and 570 may be used to supplied a controlled voltage to the interpolation stage, e.g., at control voltage inputs 416 and 426 of FIG. 4.

Figure 6:
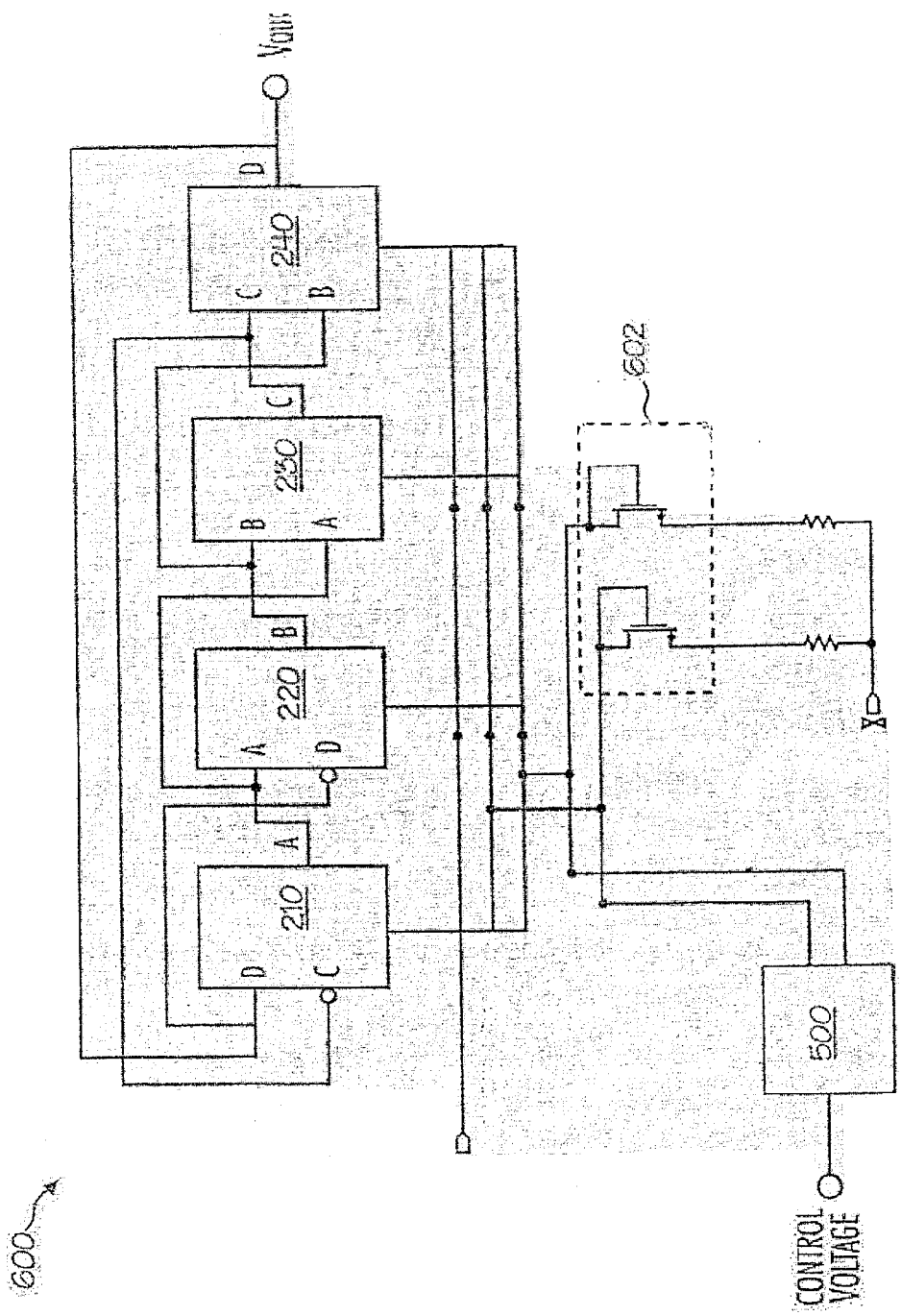
FIG. 6 illustrates a voltage-controlled ring oscillator in accordance with the present invention.

FIG. 6 schematically illustrates an exemplary ring VCO system 600 in accordance with one embodiment of the present invention. Ring VCO system 600 is similar to the previous systems 200 and 300, and thus where indicated, like numerals depict like elements. Exemplary system 600 includes differential V-I translator 500 and each of the interpolation stages, 210, 220, 230 and 240, may each be incorporated as interpolation stage 400. System 600 is configured in a look-ahead architecture in accordance with the present invention; as such, the outputs of the various interpolation stages are labeled A–D as in system 300.

In general, the frequency of oscillation of ring VCO 600 is controlled using a differential control voltage. The differential control voltage drives the differential of V-I translator 500 and the output of V-I translator 500 is used to generate control voltages for the interpolation stages through a voltage mirror 602. Voltage mirror 602 may include an suitable electrical device for voltage mirroring, such as transistors.

As previously described, ring VCO system 600 provides a ring oscillator having a reduced delay architecture provided by "look-ahead" interpolation. Thus, ring VCO system of the present invention provides a higher maximum operating frequency than conventional ring VCO systems.

It should be appreciated that the particular implementations shown and described herein are illustrative of various embodiments of the invention including its best mode, and are not intended to limit the scope of the present invention in any way. Indeed, for the sake of brevity, conventional techniques for signal processing, data transmission, signaling, and network control, and other functional aspects of the systems (and components of the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical communication system.

The present invention has been described above with reference to exemplary embodiments. However, those skilled in the art having read this disclosure will recognize that changes and modifications may be made to the embodiments without departing from the scope of the present invention. For instance, the present invention has been described with a four stage voltage-controlled oscillator, however, various number of stages may be implemented. These and other changes or modifications are intended to be included within the scope of the present invention, as expressed in the following claims.

What is claimed is:

1. A voltage-controlled ring oscillator comprising:
 a plurality of interpolation stages having two signal inputs and a signal output, each of said stages receiving a first signal input comprising an output from an immediate previous stage (X) and a second signal input comprising an output from a previous stage (X−1); and
 each of said stages adapted to receive first and second control voltages.

2. The voltage-controlled ring oscillator of claim 1, wherein each of said stages comprises an analog summer.

3. The voltage-controlled ring oscillator of claim 2 comprising CMOS architecture.

4. The voltage-controlled ring oscillator of claim 1 further comprising a voltage-to-current (V-I) translator in electrical communication with each of said stages.

5. The voltage-controlled ring oscillator of claim 4, wherein said V-I translator comprises an input port and two output ports.

6. The voltage-controlled ring oscillator of claim 2, further comprising a voltage-to-current (V-I) translator in electrical communication with each of said analog summers and providing a substantially constant voltage to said analog summer.

7. The voltage-controlled ring oscillator of claim 6, further comprising a voltage mirror coupled between said V-I translator and said analog summer.

8. The voltage-controlled ring oscillator of claim 2, wherein said analog summer receives said first and second signal inputs and one of said inputs being weight limited.

9. The voltage controlled ring oscillator of claim 8, wherein said weight limited input being less than 100%.

10. The voltage-controlled ring oscillator of claim 8, wherein said weight limited input being limited to 80%.

11. A delay interpolation voltage-controlled oscillator (VCO) comprising:
    a plurality of analog summers coupled in a look-ahead interpolation configuration comprising;
        a first analog summer having a first input (A) and a second input (B) and an output (C);
        a second analog summer having a first input (B) and a second input (C) and an output (D);
        a third analog summer having a first input (C) and a second input (D) and an output (A);
        a fourth analog summer having a first input (D) and a second input (A) and an output (B),
    whereby, each of said analog summers outputs is electrically coupled as inputs to the other analog summers; and
    at least two control voltages supplied to each of said plurality of analog summers.

12. The VCO of claim 11, wherein a weight of one of said inputs to at least one of said analog summers is limited.

13. The VCO of claim 12, wherein said weight limited input is less than 100%.

14. The VCO of claim 12, wherein said weight limited input is 80%.

15. The VCO of claim 11, further comprising a voltage to current translator providing a constant voltage to said plurality of analog summers.

16. A voltage-controlled ring oscillator comprising:
    a plurality of interpolation stages coupled in a look-ahead interpolation architecture such that each of said stages includes a first and second signal input and a signal output, said first signal input comprising an output from an immediate previous stage (X) and said second signal input comprising an output from a previous stage (X−1), one of said signal inputs being weight limited to less than 100%; and
    at least two control voltages supplied to each of said stages.

17. The voltage-controlled ring oscillator of claim 16, wherein said weight limited input comprises 80%.

18. The voltage-controlled ring oscillator of claim 16, wherein each of said stages comprises an analog summer.

19. The voltage-controlled ring oscillator of claim 16, further comprising a voltage-to-current (V-I) translator in electrical communication with each of said stages.

20. The voltage-controlled ring oscillator of claim 19, wherein said V-I translator provides a substantially constant voltage to each of said stages.

21. A method for signal interpolation in a voltage-controlled oscillator (VCO) comprising a plurality of interpolation stages, said method comprising the steps of:
    applying a first control voltage to an interpolation stage (N) of said plurality of interpolation stages;
    applying a second control voltage to an interpolation stage (N) of said plurality of interpolation stages:
    applying a first signal input to said stage (N) such that said first signal comprises an output of a stage (N−1);
    applying a second signal input to said stage (N) such that said second signal comprises an output of a stag (N−2);
    using analog summation, determining a voltage representation of a time delay between said first and second signal;
    outputting said voltage representation from said stage (N); and
    repeating said method steps for each of said stages in said VCO.

22. The method for signal interpolation of claim 21, further comprising the step of weight limiting one of said first or second signal inputs.

23. The method for signal interpolation of claim 22, wherein said weight limiting step comprises limiting to 80%.

24. The method for signal interpolation of claim 21, wherein said step of applying a control voltage comprises the steps of:
    applying a differential voltage to a voltage-to-current (V-I) translator;
    outputting two differential voltages from said (V-I) translator; and
    applying said two differential voltages to two control inputs of said stage.

25. The method for signal interpolation of claim 24, further comprising the step of generating two differential voltages such that when applied to said two control inputs of said stage, a substantially constant current is received.

26. The method for signal interpolation of claim 24, wherein said step of applying a control voltage further comprises the step of applying a control voltage to a third control input such that a substantially fixed current is received.

27. A voltage-controlled ring oscillator comprising:
    a plurality of interpolation stages having two signal inputs and a signal output, each of said stages receiving a first signal input comprising an output from an immediate previous stage (X) and a second signal input comprising an output from a previous stage (X−1);
    a control voltage supplied to each of said stages; and
    a voltage-to-current (V-I) translator in electrical communication with each of said stages.

28. The voltage-controlled ring oscillator of claim 27, wherein said V-I translator comprises an input port and two output ports.

29. A voltage-controlled ring oscillator comprising:
    a plurality of interpolation stages having two signal inputs and a signal output, each of said stages receiving a first signal input comprising an output from an immediate previous stage (X) and a second signal input comprising an output from a previous stage (X−1);
    a control voltage supplied to each of said stages;
    wherein each of said stages comprises an analog summer; and
    a voltage-to-current (V-I) translator in electrical communication with each of said analog summers and providing a substantially constant voltage to said analog summers.

30. The voltage-controlled ring oscillator of claim 29, further comprising a voltage mirror coupled between said V-I translator and said analog summer.

31. The voltage-controlled ring oscillator of claim 27, wherein each of said stages comprises an analog summer and said analog summer receives said first and second signal inputs and one of said inputs being weight limited.

32. The voltage-controlled ring oscillator of claim 31, wherein said weight limited input being limited to less than 100%.

33. The voltage-controlled ring oscillator of claim 31, wherein said weight limited input being limited to 80%.

34. A delay interpolation voltage-controlled oscillator (VCO) comprising:
- a plurality of analog summers coupled in a look-ahead interpolation configuration comprising;
  - a first analog summer having a first input (A) and a second input (B) and an output (C);
  - a second analog summer having a first input (B) and a second input (C) and an output (D);
  - a third analog summer having a first input (C) and a second input (D) and an output (A);
  - a fourth analog summer having a first input (D) and a second input (A) and an output (B),
- whereby, each of said analog summers outputs is electrically coupled as inputs to the other analog summers; and
- a control voltage supplied to said plurality of analog summers;
- wherein a weight of one of said inputs to at least one of said analog summers is limited; and
- said weight limited input is 80%.

35. A delay interpolation voltage-controlled oscillator (VCO) comprising:
- a plurality of analog summers coupled in a look-ahead interpolation configuration comprising;
  - a first analog summer having a first input (A) and a second input (B) and an output (C);
  - a second analog summer having a first input (B) and a second input (C) and an output (D);
  - a third analog summer having a first input (C) and a second input (D) and an output (A);
  - a fourth analog summer having a first input (D) and a second input (A) and an output (B),
- whereby, each of said analog summers outputs is electrically coupled as inputs to the other analog summers;
- a control voltage supplied to said plurality of analog summers; and
- a voltage to current translator providing a constant voltage to said plurality of analog summers.

36. A voltage-controlled ring oscillator comprising:
- a plurality of interpolation stages coupled in a look-ahead interpolation architecture such that each of said stages includes a first and second signal input and a signal output, said first signal input comprising an output from an immediate previous stage (X) and said second signal input comprising an output from a previous stage (X−1), one of said signal inputs being weight limited to less than 100%; and
- a control voltage supplied to each of said stages;
- wherein said weight limited input comprises 80%.

37. A voltage-controlled ring oscillator comprising:
- a plurality of interpolation stages coupled in a look-ahead interpolation architecture such that each of said stages includes a first and second signal input and a signal output, said first signal input comprising an output from an immediate previous stage (X) and said second signal input comprising an output from a previous stage (X−1), one of said signal inputs being weight limited to less than 100%;
- a control voltage supplied to each of said stages; and
- a voltage-to-current (V-I) translator in electrical communication with each of said stages.

38. The voltage-controlled ring oscillator of claim 37, wherein said V-I translator provides a substantially constant voltage to each of said stages.

39. A method for signal interpolation in a voltage-controlled oscillator (VCO) comprising a plurality of interpolation stages, said method comprising the steps of:
- applying a control voltage to an interpolation stage (N) of said plurality of interpolation stages;
- applying a first signal input to said stage (N) such that said first signal comprises an output of a stage (N−1);
- applying a second signal input to said stage (N) such that said second signal comprises an output of a stage (N−2);
- using analog summation, determining a voltage representation of a time delay between said first and second signal;
- outputting said voltage representation from said stage (N);
- repeating said method steps for each of said stages in said VCO; and
- weight limiting one of said first or second signal inputs;
- wherein said weight limiting step comprises limiting to 80%.

40. A method for signal interpolation in a voltage-controlled oscillator (VCO) comprising a plurality of interpolation stages, said method comprising the steps of:
- applying a control voltage to an interpolation stage (N) of said plurality of interpolation stages;
- applying a first signal input to said stage (N) such that said first signal comprises an output of a stage (N−1);
- applying a second signal input to said stage (N) such that said second signal comprises an output of a stage (N−2);
- using analog summation, determining a voltage representation of a time delay between said first and second signal;
- outputting said voltage representation from said stage (N); and
- repeating said method steps for each of said stages in said VCO;
- wherein said step of applying a control voltage comprises the steps of:
  - applying a differential voltage to a voltage-to-current (V-I) translator;
  - outputting two differential voltages from said (V-I) translator; and
  - applying said two differential voltages to two control inputs of said stage.

41. The method for signal interpolation of claim 40, further comprising the step of generating two differential voltages such that when applied to said two control inputs of said stage, a substantially constant current is received.

42. The method for signal interpolation of claim 40, wherein said step of applying a control voltage further comprises the step of applying a control voltage to a third control input such that a substantially fixed current is received.

* * * * *